(12) United States Patent
Chan et al.

(10) Patent No.: US 8,487,326 B2
(45) Date of Patent: Jul. 16, 2013

(54) LED DEVICE HAVING A TILTED PEAK EMISSION AND AN LED DISPLAY INCLUDING SUCH DEVICES

(75) Inventors: Chi Keung Chan, Sheung Shui (HK); Zhi Kuan Zhang, Shatin (HK); Yue Kwong Lau, Laguna (HK); Xiang Fei, Huizhou (CN); Hao Liu, Huizhou (CN); Ju Zuo Sheng, Huizhou (CN); David Todd Emerson, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/161,263

(22) Filed: Jun. 15, 2011

(65) Prior Publication Data
US 2012/0119230 A1    May 17, 2012

Related U.S. Application Data

(63) Continuation of application No. PCT/CN2011/000604, filed on Apr. 7, 2011, and a continuation-in-part of application No. 12/868,567, filed on Aug. 25, 2010, which is a continuation-in-part of application No. 12/635,818, filed on Dec. 11, 2009, now Pat. No. 8,362,512, which is a continuation of application No. 11/739,307, filed on Apr. 24, 2007, now Pat. No. 7,649,209, and a continuation-in-part of application No. 12/498,277, filed on Jul. 6, 2009.

(60) Provisional application No. 60/745,478, filed on Apr. 24, 2006.

(51) Int. Cl.
*H01L 33/08* (2010.01)

(52) U.S. Cl.
USPC .. 257/91; 257/98; 257/E33.067; 257/E33.058

(58) Field of Classification Search
USPC ........ 257/91, 98, E33.069, E33.005, E33.068
See application file for complete search history.

(56) References Cited

U.S. PATENT DOCUMENTS

| | | | |
|---|---|---|---|
| 7,190,004 B2 * | 3/2007 | Nagai et al. | 257/102 |
| 2004/0211970 A1 * | 10/2004 | Hayashimoto et al. | 257/98 |
| 2011/0001149 A1 | 1/2011 | Chan et al. | |

FOREIGN PATENT DOCUMENTS

| | | |
|---|---|---|
| CN | 200956374 Y | 10/2007 |
| CN | 101958390 A | 1/2011 |
| EP | 1 686 630 A2 | 12/2005 |
| JP | 2005-285899 | 10/2005 |

OTHER PUBLICATIONS

PCT International Search Report and Written Opinion for PCT/CN2011/000604, mailing date Jan. 19, 2012.

* cited by examiner

*Primary Examiner* — Zandra Smith
*Assistant Examiner* — Paul Patton
(74) *Attorney, Agent, or Firm* — Brinks Hofer Gilson & Lione

(57) ABSTRACT

An LED package and a lead frame include a reflector cup having a bottom surface with an LED asymmetrically positioned on the bottom surface and a wall surface inclined relative to the bottom surface and defining an opening at an upper end thereof. The bottom surface of the reflector cup has a first axial dimension along a first axis and a second axial dimension along a second axis, orthogonal to the first axis. A display having an asymmetrical FFP and asymmetrical screen curve includes an array of the LED modules including a plurality of LED packages. At least some of the LED packages include a dome-shaped lens asymmetrically positioned with respect to a geometric center of the bottom surface of the reflector cup.

27 Claims, 14 Drawing Sheets

LED DEVICE HAVING A TILTED PEAK EMISSION AND AN LED DISPLAY INCLUDING SUCH DEVICES

RELATED APPLICATIONS

This application is a continuation of International Application No. PCT/CN2011/000604, filed Apr. 7, 2011, and is a continuation-in-part of pending U.S. application Ser. No. 12/498,277, filed Jul. 6, 2009, and is a continuation-in-part of pending U.S. application Ser. No. 12/868,567, filed Aug. 25, 2010, which is a continuation-in-part of pending U.S. application Ser. No. 12/635,818, filed Dec. 11, 2009, which is a continuation of U.S. application Ser. No. 11/739,307, filed Apr. 24, 2007 (now U.S. Pat. No. 7,649,209), which claims the benefit of U.S. Provisional Application No. 60/745,478, filed Apr. 24, 2006. All of the aforementioned applications are incorporated herein by reference in their entirety.

FIELD OF THE DISCLOSURE

The disclosure relates, generally, to light emitting diodes (LED) and, more particularly, to LED devices with tilted peak emission and to LED displays including such devices.

BACKGROUND

In recent years, there have been dramatic improvements in LED technology such that LEDs of increased brightness and color fidelity have been introduced. Due to these improved LEDs and improved image processing technology, large format, full color LED video screens have become available and are now in common use. Large format LED displays typically comprise a combination of individual LED panels providing image resolutions determined by the distance between adjacent pixels or "pixel pitch."

Outdoor displays, which are intended for viewing from greater distances, have relatively large pixel pitches and usually comprise discrete LED arrays. In the discrete LED arrays, a cluster of individually mounted red, green, and blue LEDs are driven to form what appears to the viewer as a full color pixel. Large screen LED based displays (often referred to as giant screens) are becoming more common in many indoor and outdoor locations, such as at sporting events, race tracks, concerts and in large public areas such as Times Square in New York City. Many of these displays or screens can be as large as 60 feet tall and 60 feet wide. These screens can comprise thousands of "pixels" or "pixel modules", each of which can contain a plurality of LEDs. The pixel modules use high efficiency and high brightness LEDs that allow the displays to be visible from relatively far away, even in the daytime when subject to sunlight. The pixel modules can have as few as three or four LEDs (one red, one green, and one blue) that allow the pixel to emit many different colors of light from combinations of red, green and/or blue light. In the largest jumbo screens, each pixel module can have dozens of LEDs. The pixel modules are arranged in a rectangular grid. For example, a grid can be 640 modules wide and 480 modules high, with the end size of the screen being dependent upon the actual size of the pixel modules.

Conventional LED based displays are controlled by a computer system that accepts an incoming signal (for example a TV signal) and based on the particular color needed at the pixel module to form the overall display image, the computer system determines which LED in each of the pixel modules is to emit light and how brightly. A power system can also be included that provides power to each of the pixel modules and the power to each of the LEDs can be modulated so that it emits at the desired brightness. Conductors are provided to apply the appropriate power signal to each of the LEDs in the pixel modules.

Most of these giant screens are typically mounted at an elevation above the viewer's eye level, such as on the side of building or the top of the grandstands in a stadium. Accordingly, much of the light emitted by the display is not seen by the viewer and is wasted. Additionally, the wasted light may cause light pollution by creating unwanted light reflection and/or glare. One way to reduce the amount of light that is wasted is by mounting the display at an angle to better match the viewer's line of sight, but this can require complex and expensive mounting hardware that is difficult to use, particularly for very large displays mounted at high elevations.

SUMMARY

One objective of this disclosure is to provide improved LED devices that increase the efficiency of light emitted from large LED displays. The disclosed LED devices and LED displays may also save energy and reduce light pollution.

One embodiment of the LED package includes a reflector cup having a bottom surface and a wall surface inclined relative to the bottom surface and defining an opening at an upper end thereof. An LED is mounted on the bottom surface. The bottom surface of the reflector cup has a first axial dimension about 0.91 mm to about 1.1 mm along a first axis and a second axial dimension of about 0.66 mm to about 0.91 mm along a second axis orthogonal to the first axis.

Another embodiment discloses a display that includes lead frame including a reflector cup having a bottom surface and a wall surface inclined relative to the bottom surface and defining an opening at an upper end thereof. The bottom surface has a first axial dimension about 0.91 mm to about 1.1 mm along a first axis and a second axial dimension of about 72% to about 100% of the first axial dimension along a second axis orthogonal to the first axis.

Yet another embodiment discloses a display including a substrate carrying an array of light emitting diode (LED) packages arranged in vertical columns and horizontal rows. At least one of the LED packages has a lead frame having a reflector cup. The reflector cup has a bottom surface and a wall surface inclined relative to the bottom surface and defining an opening at an upper end thereof. There is an LED mounted on the bottom surface. The bottom surface has a first axial dimension about 0.91 mm to about 1.1 mm along a first axis and a second axial dimension of about 0.66 mm to about 0.91 mm along a second axis orthogonal to the first axis. The display further includes signal processing and LED drive circuitry electrically connected to selectively energize the array of LED packages for producing visual images on the display.

A further embodiment discloses an LED package including a reflector cup having a bottom surface and a wall surface inclined relative to the bottom surface and defining an opening at an upper end thereof. An LED is mounted on the bottom surface. The bottom surface has a first axial dimension along a first axis and a second axial dimension along a second axis orthogonal to the first axis. The bottom surface has a curved border portion and a straight border portion. The curved border portion has a length larger greater than half of a perimeter of the bottom surface.

A still further another embodiment discloses an LED package including a reflector cup having a bottom surface and a wall surface inclined relative to the bottom surface and defining an opening at an upper end thereof. An LED is mounted on the bottom surface. The bottom surface of the oval-shaped reflector cup has a first axial dimension of less than about 0.89 mm and a second axial dimension of less than about 0.64 mm along a second axis orthogonal to the first axis.

BRIEF DESCRIPTION OF THE DRAWING

FIG. 12($b$) is a plot of the horizontal far field pattern of an LED device according to one embodiment of the disclosure with respect to a first negative view angle;

FIG. 12($c$) is a plot of the horizontal far field pattern of an LED device according to one embodiment of the disclosure with respect to a second negative view angle;

FIG. 12($d$) is a plot of the vertical far field pattern of an LED device according to one embodiment of the disclosure;

FIG. 13($b$) is plot of the horizontal screen curve of an LED device according to one embodiment of the disclosure with respect to a first negative view angle;

FIG. 13($c$) is a plot of the horizontal screen curve of an LED device according to one embodiment of the disclosure with respect to a second negative view angle; and FIG. 13($d$) is a plot of the vertical screen curve of an LED device according to one embodiment of the disclosure.

DETAILED DESCRIPTION

Figure 1:
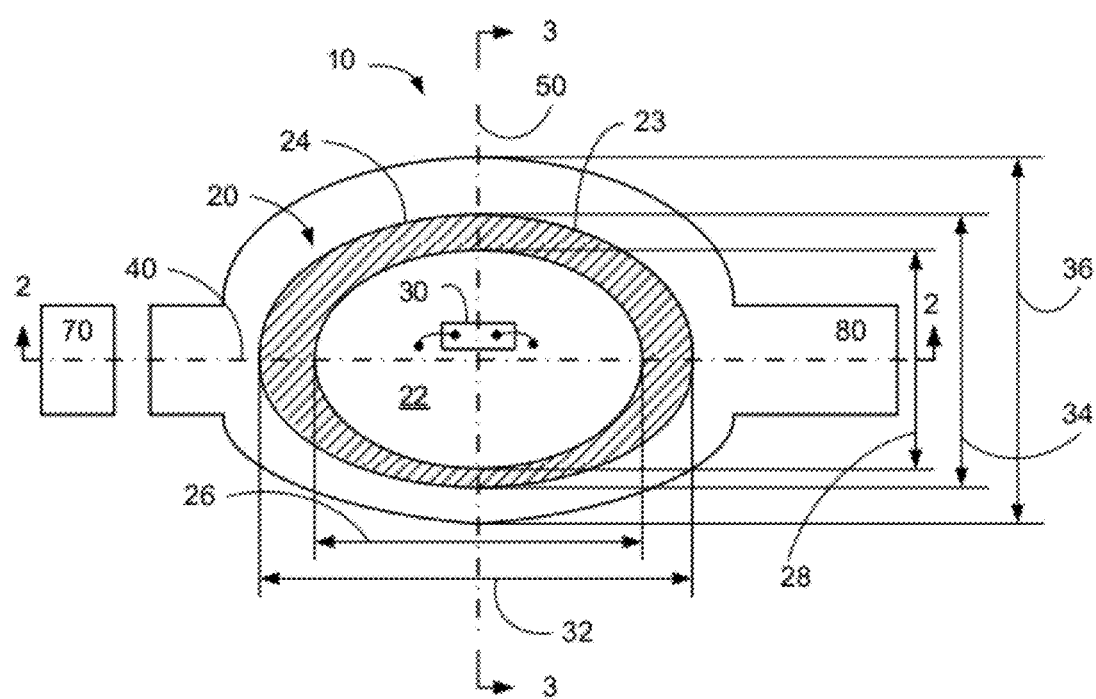
FIG. 1 is a top view of an LED device according to an embodiment of the present disclosure.

The following description presents preferred embodiments of the disclosure representing the best mode contemplated for practicing the disclosure. This description is not to be taken in a limiting sense but is made merely for the purpose of describing the general principles of the disclosure, the scope of which is defined by the appended claims.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
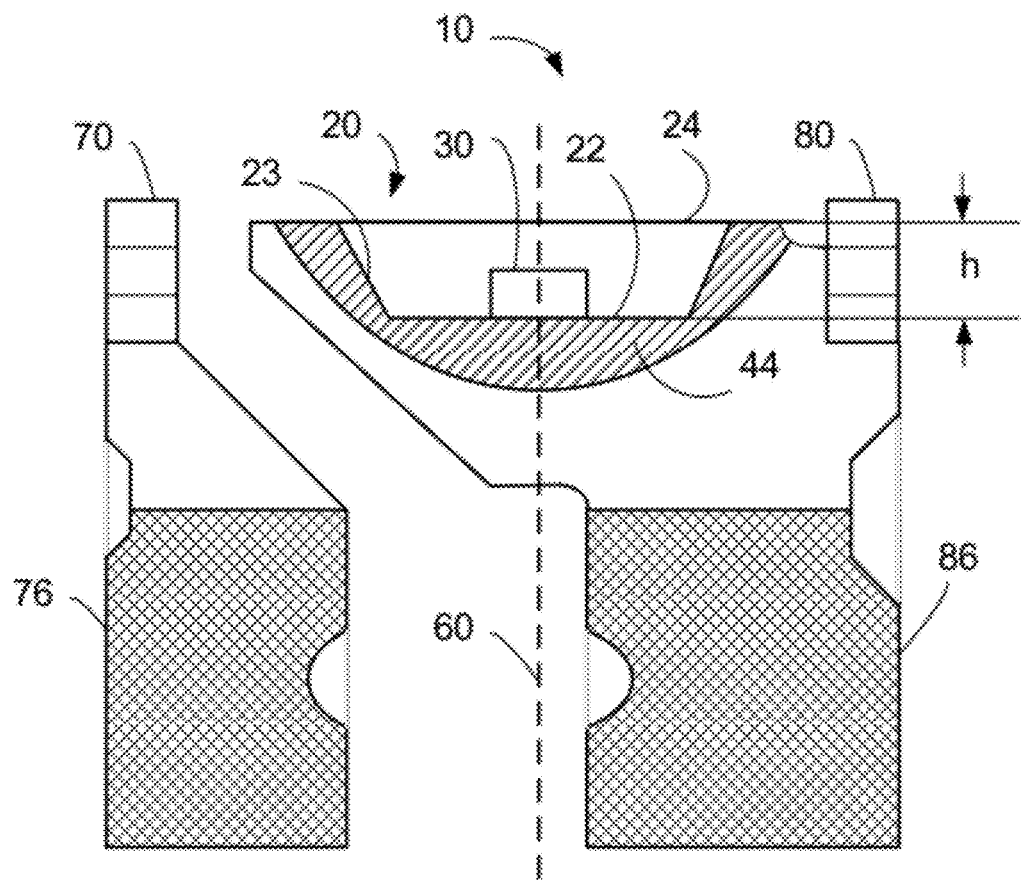
FIG. 2 is a cross-sectional view of the embodiment illustrated in FIG. 1, taken along section line 2-2.
Figure 3:
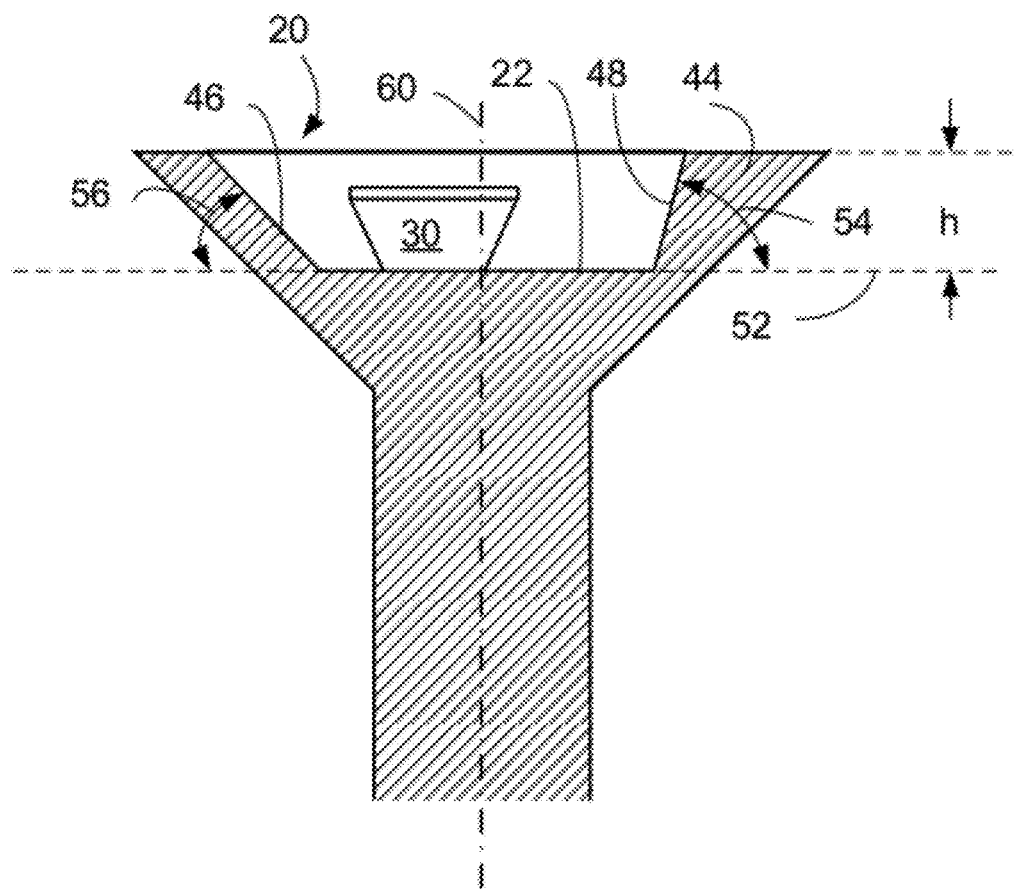
FIG. 3 is a cross-sectional view of the embodiment in FIG. 1, taken along view line 3-3.

FIGS. 1-3 depict an embodiment of an LED package 10 in different views. FIG. 1 is a top view of LED package 10 illustrating a reflector cup 20 having a bottom surface 22 and a wall surface 23 inclined relative to bottom surface 22 and defining an opening 24 at an upper end of reflector cup 20. An LED 30 is mounted on bottom surface 22. There are two topside wirebonds on the upper surface of LED 30 connected to two wires to bottom surface 22. LED 30 may have other configurations, such as chips with no wirebonds or vertical chip with one wirebond. LED 30 may also be flipped or rotated for desired far field pattern. Bottom surface 22 has a first axial dimension 26 along a first axis 40 and a second axial dimension 28 along a second axis 50 orthogonal to first axis 40. In some embodiments, preferably, first axial dimension 26 is about 0.91 mm to about 1.1 mm, and second axial dimension 28 is about 0.66 mm to about 0.91 mm. More preferably, first axial dimension 26 is about 0.95 mm to about 1.05 mm and second axial dimension 28 is about 0.75 mm to about 0.85 mm.

In accordance with the disclosure, it is contemplated that the size of reflector cup 20 be fabricated to extremely small dimensional tolerances. These small tolerances are only limited by the manufacturing capability of the stamping process used to form the reflector cup and the lead frame assembly process, and to the smallest finite size of LED 30. Accordingly in other embodiments, first axial dimension 26 is less than about 0.89 mm, and second axial dimension 28 is less than about 0.64 mm. Further, first axial dimension 26 can be less than about 0.85 mm and second axial dimension 28 less than about 0.6 mm. Still further, the length of first axial dimension 26 and second axial dimension 28 is are about the same dimensions of LED 30 with a slightly additional size to allow for electrical connection of LED 30 and light propagation consistent with the performance features of the devices disclosed herein.

In one embodiment, an area of bottom surface 22 is greater than an area of a bottom surface of LED 30 and less than an area of opening 24. In other embodiments, a ratio of the first axial dimension 26 to second axial dimension 28 may range from about 1:1 to about 11:7. For example, the ratio of first axial dimension 26 to second axial dimension 28 may be about 5:4. Preferably, in some embodiments, second axial dimension 28 is about 72% to about 100% of first axial dimension 26. More preferably, second axial dimension 28 is about 75% to about 90% of first axial dimension 26. Most preferably, second axial dimension 28 is about 78% to about 85% of first axial dimension 26.

Opening 24 also has a first axial dimension 32 along a first axis 40 and a second axial dimension 34 along a second axis 50, orthogonal to first axis 40. Preferably, first axial dimension 32 is about 1.3 mm to about 1.5 mm and second axial dimension 34 is about 0.94 mm to about 1.14 mm. More preferably, first axial dimension 32 is about 1.35 mm to about 1.45 mm, and second axial dimension 34 is about 0.99 mm to about 1.09 mm.

Consistent with the contemplation of dimensional features to within manufacturing tolerance and the finite size limits of LED 30, the size of opening 24 will maintain a relationship to the size of bottom surface 22, such that the light propagation is consistent with the performance features of the devices disclosed herein. Accordingly, in other embodiments, first axial dimension 32 is less than about 1.25 mm and second axial dimension 34 is less than about 1.00 mm. Further, first axial dimension 32 can be less than about 1.2 mm, and second axial dimension 34 less than about 0.95 mm.

In the embodiments disclosed herein, the first dimension is longer than the second dimension so that the view angle along first axis 40 is wider than the view angle along the second axis 50. For example, first axial dimension 26 is about 0.2 mm to about 0.4 mm longer than second axial dimension 28. For example, LED 30 may have a horizontal view angle along first axis 40 of about −60° to +60°. As used herein, the term "view angle" is the angular extent to which the intensity of light emitted from the LED is about 50% of the peak intensity in a far field pattern (FFP). The FFP is an optical characteristic of an LED and represents the luminous intensity in space. Most commonly, the FFP illustrates a normalized luminous intensity ratio at different radiation angles. In this embodiment, LED package 10 is improved to generate an asymmetrical FFP in a first direction with uniform FFP in a second direction. Additional features of asymmetrically positioned LEDs and reflector cup designs are disclosed in the applicants co-pending U.S. patent application Ser. No. 12/498,277 and co-pending U.S. patent application Ser. No. 12/868,567, the disclosures of which are incorporated by reference herein.

LED 30, when disposed at the geometrical center of bottom surface, may have a vertical view angle along second axis 50 of about −28° to +28. When LED 30 is displaced away from the geometrical center of bottom surface 22, which is the crossing point between first axis 40 and second axis 50 in FIG. 1, LED 30 may have a vertical view angle of about −40° to +10° and a peak intensity at about −20°. In which case, the view angle is tilted at about −20. As used herein, the term "geometrical center" of a surface is defined as the centroid of a plane figure or, in other words, the intersection of straight lines that divide the plan figure into two parts of equal moment. In the context of the device disclosed herein, in some embodiments, the plan figure is an opening of the reflector cup.

In some embodiments, the geometrical center of bottom surface 22 may coincide or overlap with the crossing point of first axis 40 and second axis 50 for a relatively small tilted view angle. However, the geometric center of bottom surface 22 may also be displaced away from a crossing point of first axis 40 and second axis 50 to obtain a relatively large tilted view angle. Similarly, geometric center of opening 24 may coincide or overlap the crossing point of first axis 40 and second axis 50 in some embodiments, resulting in a relatively small tilted view angle. Further, the geometric center of opening 24 may be displaced away from the crossing point of first axis 40 and second axis 50 in some embodiments, resulting in a relatively large tilted view angle.

FIG. 2 is a cross-sectional view of the embodiment in FIG. 1, taken along section line 2-2. LED 30 is mounted bottom surface 22 in reflector cup 20. In the illustrated embodiment, reflector cup 20 has a depth of preferably about 0.2 mm to about 0.3 mm, such that wall surface 23 has a height "h" about 0.2 mm to about 0.3 mm. In some embodiments, height "h" may be less than about 0.2 mm. In other embodiments, height "h" may be less than about 0.15 mm. Further, the height h can range from about 0.16 mm to about 0.24 mm. Consistent with the contemplation of minimal dimensional features of reflector cup 20, height "h" may only large enough to accommodate the profile height of LED 30. In some embodiments, height "h" may even be smaller than the profile height of LED 30. A vertical axis 60 extends through the center of reflector cup 20.

LED package 10 includes a lead frame having bond pads 70 and 80 that are conductively connected with leads 76 and 86, respectively. Further, reflector cup 20 has a wall 44 that is conductively connected to LED chip 30 and lead 86. Wall 44 may have a non-uniform thickness and the material of construction of wall 44 and leads 76 and 86 may be copper, iron, or other suitable conductive material that can also dissipate heat. Heat dissipation is beneficial as LED package 10 may generate a peak luminous intensity of up to about 3000 mcd. Notably, the working current is less than about 20 mA. The working current may be less than about 10 mA.

FIG. 3 illustrates a cross-sectional view of LED package 10 of FIG. 1, taken along section line 3-3. As seen in FIG. 3, LED 30 is offset from vertical axis 60. Referring to FIG. 1-3, LED package 10 has a reflector cup 20 including bottom surface 22 and a wall surface 23, inclined relative to bottom surface 22. Reflector cup 20 may have an oval shape or a general round shape. The degree of inclination of wall surface 23 relative to bottom surface 22 continually varies such that wall surface 23 has a relatively steep portion 48 and a relatively shallow portion 46. In FIG. 3, relatively steep portion 48 may be near the lower portion of reflector cup 20, and relatively shallow portion 46 may be near the upper portion of reflector cup 20. For example, wall surface 23 defines a first angle 54 between steep portion 48 and plane 52 that extends outwards from bottom surface 22, and a second angle 56 between shallow portion 46 and plane 52. Preferably, angle 56 is inclined at about 40° to about 50° relative to bottom surface 22 and angle 54 is inclined at about 50° to about 85° relative to bottom surface 22. More preferably, first angle 54 may be about 75° to about 85°, and second angle may be about 42° to about 48°. Further, first angle 54 may be greater than second angle 56, so that, for example, more light will be reflected towards a lower viewing angle from an upper portion of reflector cup 22.

Figure 4:
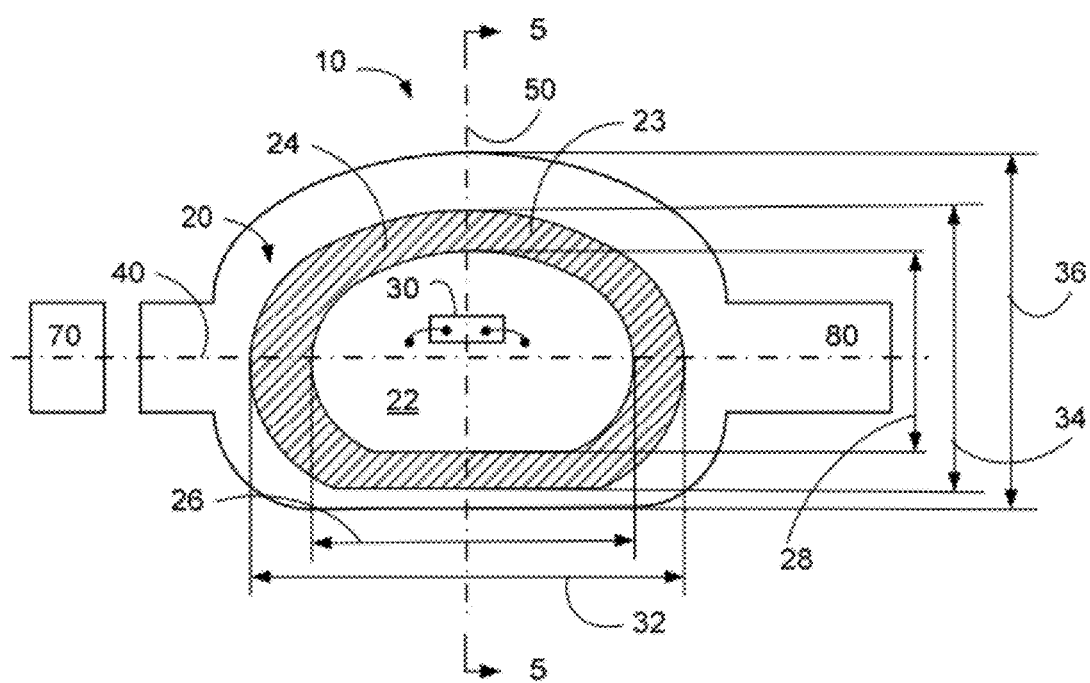
FIG. 4 is a top view of an LED device according to another embodiment of the present disclosure.
Figure 5:
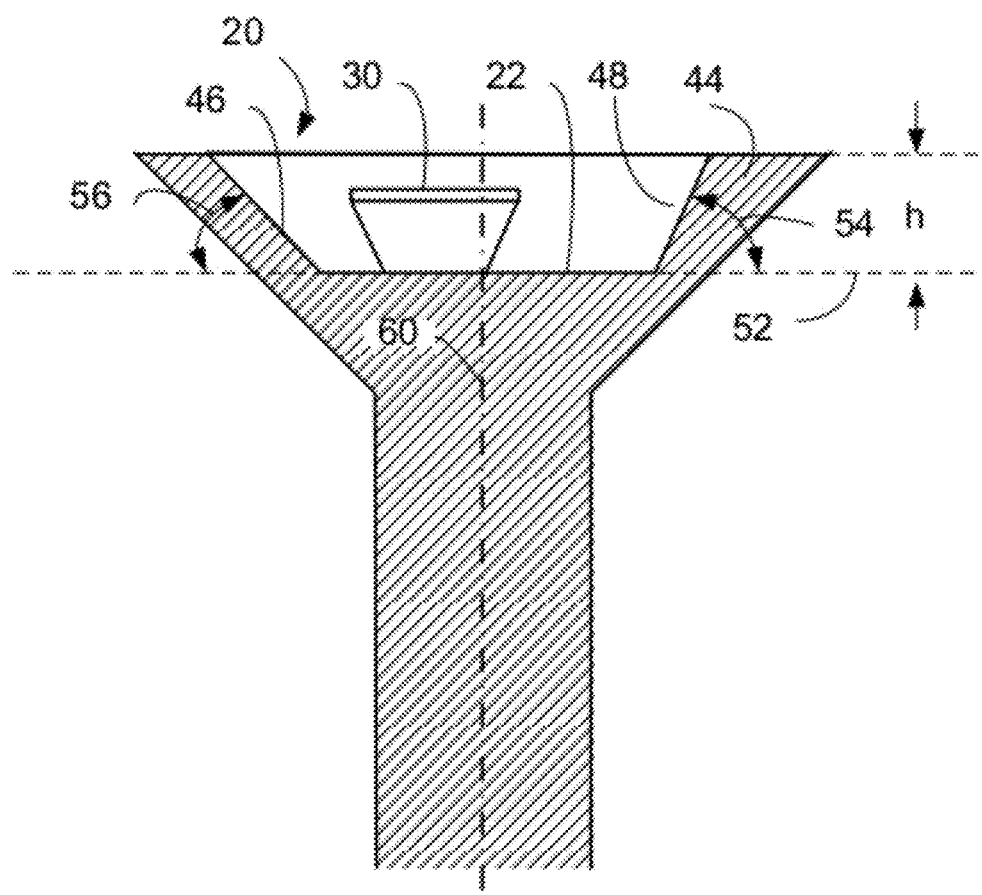
FIG. 5 is an illustration of a partial cutaway profile view of the LED covered by a lens, taken along view lines 5-5.

FIG. 4 is a top view of an LED device according to another embodiment of the present disclosure and FIG. 5 illustrates a cross-sectional view of the embodiment in FIG. 4, taken along section lines 5-5. In similarity to the previous embodiment, LED 30 is offset with respect to vertical axis 60. There are two topside wirebonds on the upper surface of LED 30 connected to two wires to bottom surface 22. LED 30 may have other configurations, such as chips with no wirebonds or vertical chip with one wirebond. LED 30 may also be flipped or rotated for desired far field pattern. As seen in FIGS. 4 and 5, bottom surface 22 has a straight border portion at the lower side and a curved border portion at the upper side thereof. The curved border portion is longer than the straight border portion. The curved border portion of bottom surface 22 has a length greater than half of a perimeter of bottom surface 22. Similarly, opening 24 has a straight border portion at the lower side and a curved border portion at the upper side. Preferably, the curved border portion of opening 24 has a length greater than half of a perimeter of bottom surface 24. Accordingly, angle 54 in FIG. 5 may be slightly less compared to the first embodiment of FIGS. 1-3. For example, angle 54 is preferably about 50° to about 75°, more preferably, about 55° to about 65°, and most preferably, about 57° to about 63°.

Figure 6:
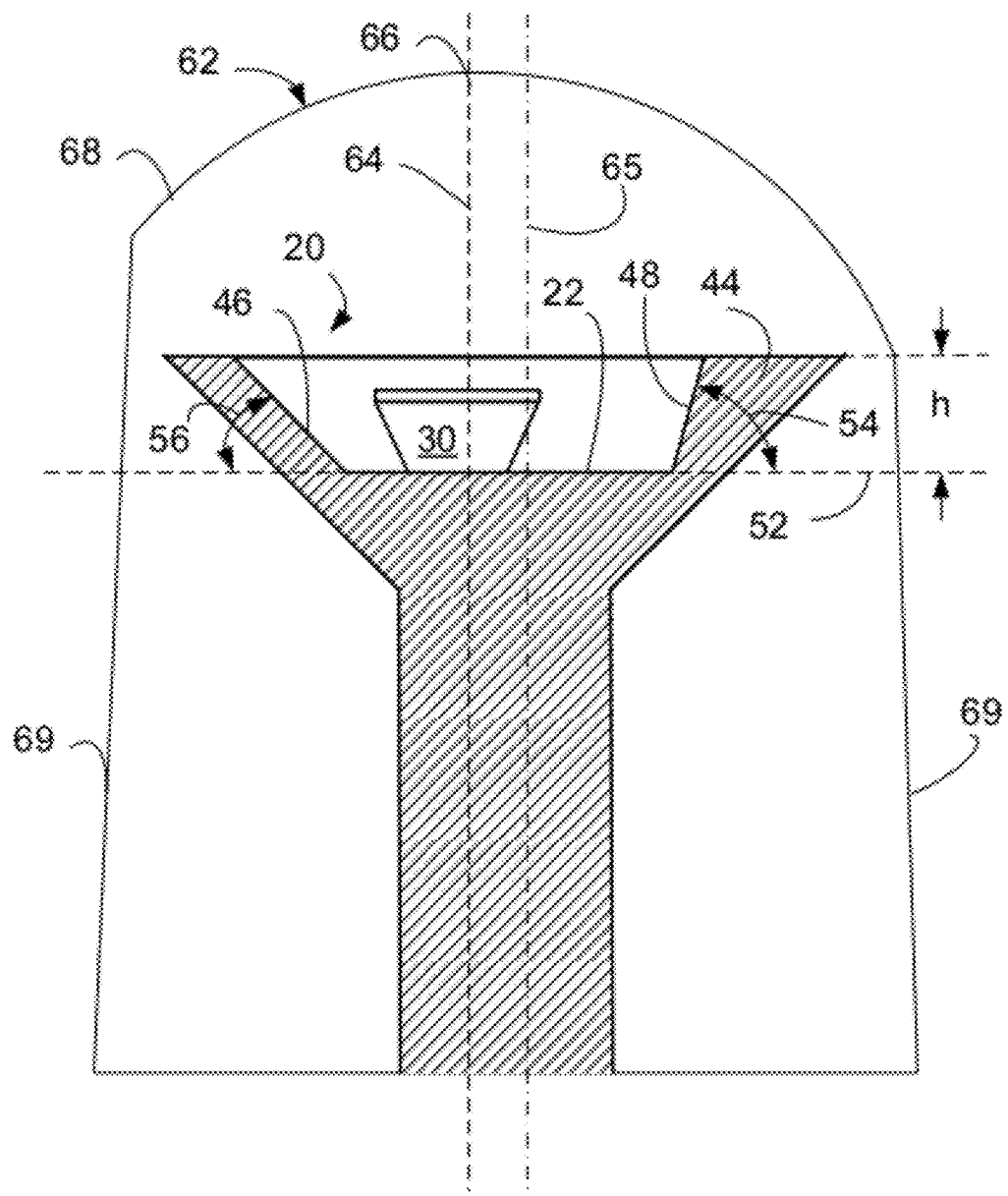
FIG. 6 is a first side profile view of a lens covering an LED device.
Figure 7:
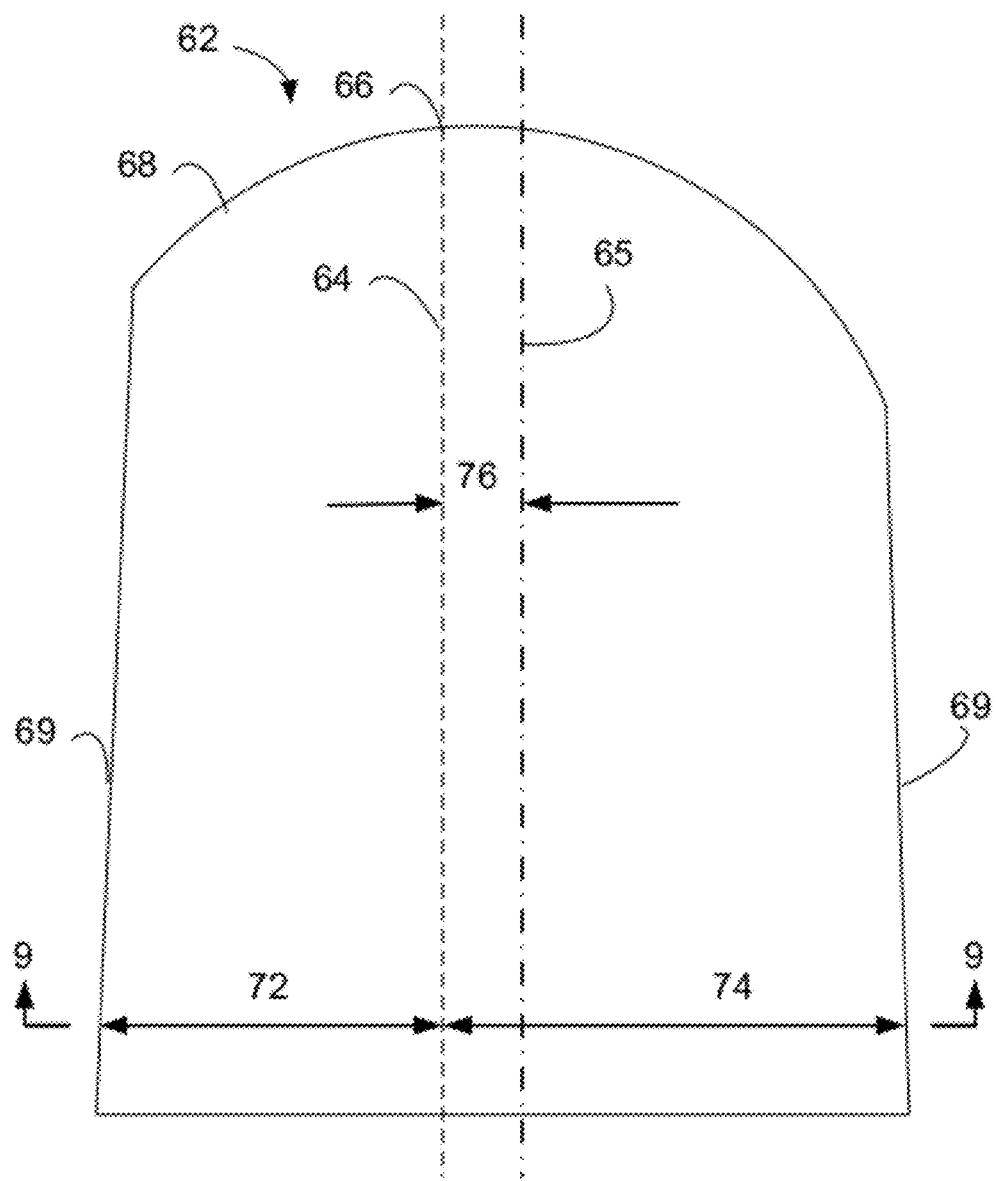
FIG. 7 is a profile view of the lens in FIG. 6.
Figure 8:
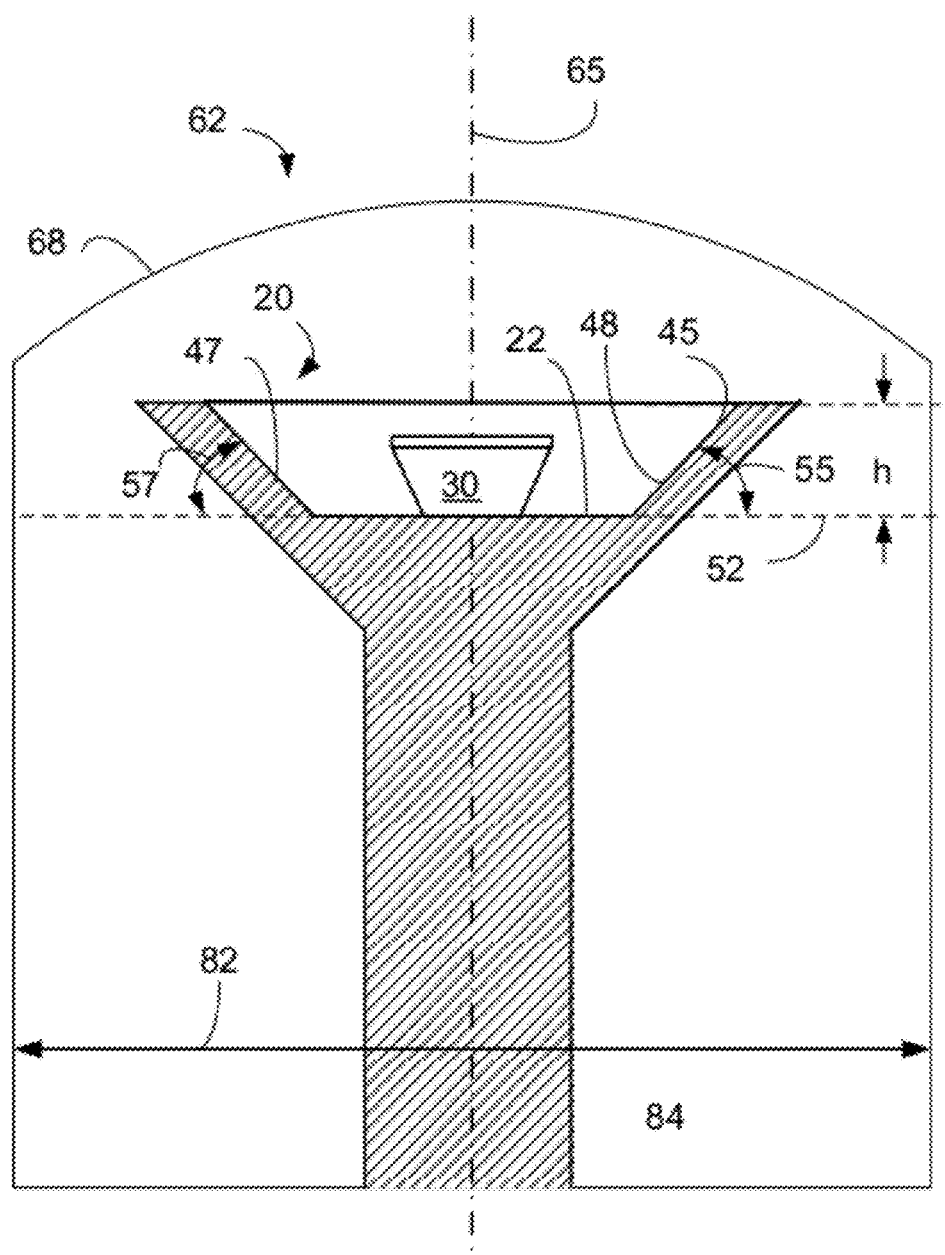
FIG. 8 is a second side view of the lens in FIG. 6 covering the LED device.
Figure 9:
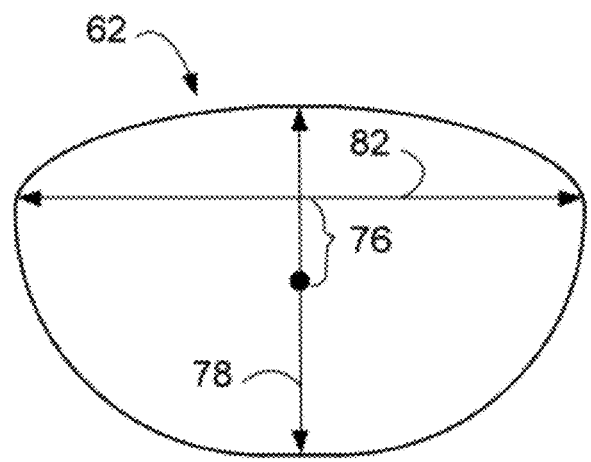
FIG. 9 is a top view of the lens in FIG. 6.

FIG. 6 illustrates reflector cup 20 covered by a lens 62 and FIGS. 7-9 illustrate different views of lens 62. Lens 62 preferably has a dome-shape that is asymmetrically positioned with respect to a geometric center of bottom surface 22. Lens 62 may have a profile height of preferably about 5.3 mm to about 7.3 mm, more preferably about 5.8 mm to about 6.8 mm, and most preferably, about 6.0 mm to about 6.6 mm. Two vertical axes 64 and 65 are shown in FIGS. 6 and 7. Axis 64 is vertically aligned with a geometric center of lens 66, and axis 65 is vertically aligned with the center of a cross-section of lens 64 taken at the bottom of lens 62, near section line 9-9 of FIG. 7. Lens 62 has rounded upper surface 68 connecting relatively vertical walls 69. Upper surface 68 has geometric center 66 is located at intersection point of axis 64 and upper surface 68. The distance 76 between axis 64 and axis 65 is about 0.2 mm to about 0.4 mm. For example, geometric center 66 may be displaced about 0.2 mm to about 0.4 mm away from the geometric center of a bottom cross-section of the lens along section lines 9-9, as illustrated in FIGS. 7 and 9. Preferably, distance 76 is about 0.25 mm to about 0.35 mm and, more preferably, about 0.27 mm to about 0.33 mm. Accordingly, the profile of lens 62 is somewhat skewed in one direction and, as seen in FIG. 9, lens 62 has a somewhat oblong cross-sectional profile with one somewhat flattened side and an opposite more rounded side.

Figure 10:
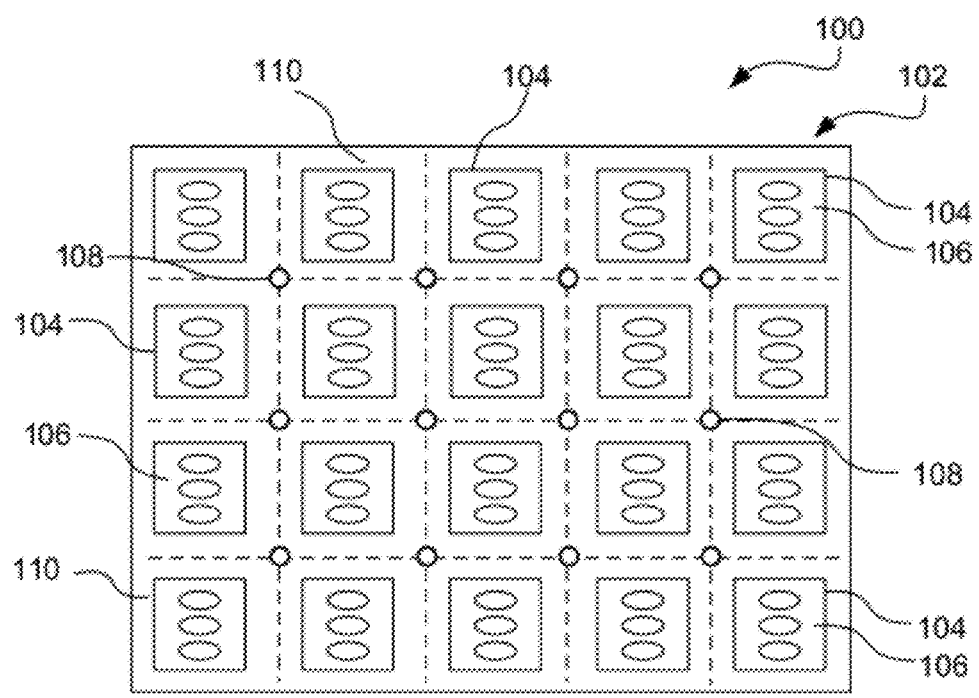
FIG. 10 is a plan view a portion of an LED display screen incorporating the LED devices in accordance with embodiments of the present disclosure.

FIG. 10 is a plan view of a portion of an LED display screen 100, for example, an outdoor display screen including a driver PCB 102 carrying a large number of substrates 104 arranged in rows and columns. Display screen 100 is divided into a plurality of pixels 110, each including a substrate 104 having at least a red, blue, and green LED 106 thereon. Each pixel of the display may have a size about 10 mm by about 10 mm or larger. Further, each substrate 104 may be driven by different voltage levels. The substrates 104 include at least some LEDs 106 having the design features described above. Substrates 104 are electrically connected to metal traces or pads (not shown) on PCB 102 that connect the LEDs to appropriate electrical signal processing and driver circuitry (not shown). There may be holes 108 between pixels 110 used to anchor the PCB 102 to mounting platforms.

Figure 11:
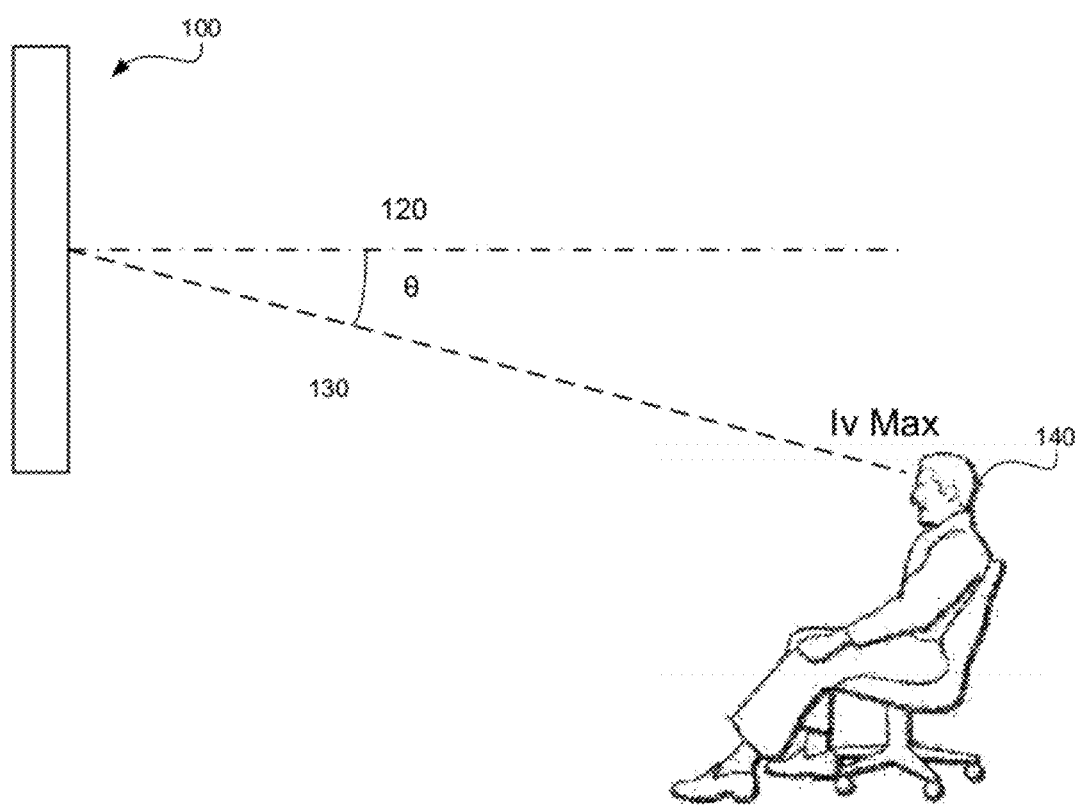
FIG. 11 is an illustration of the LED display screen of FIG. 10 in relationship to a viewer.
Figure 12A:
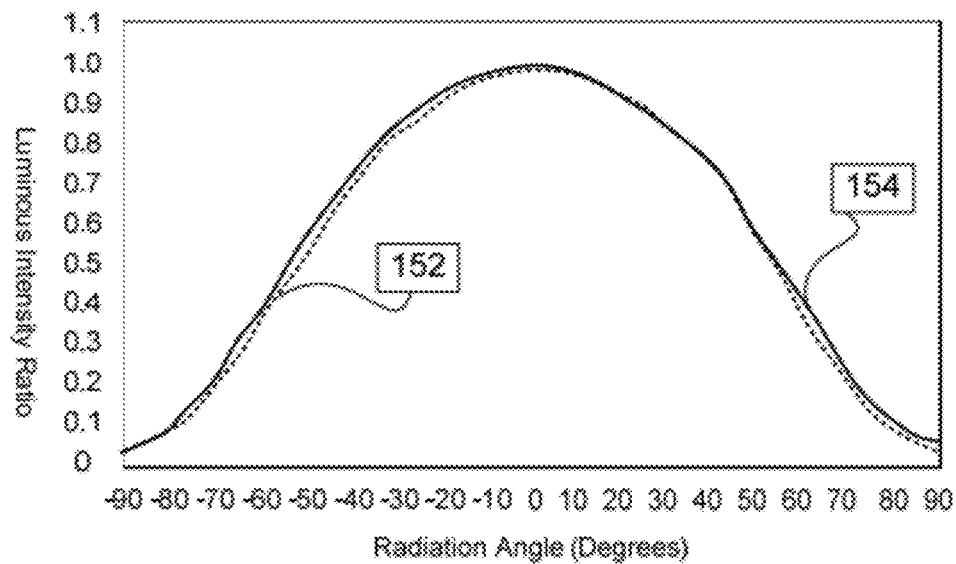
FIG. 12($a$) is a plot of the horizontal far field pattern of an LED device according to one embodiment of the disclosure.
Figure 12B:
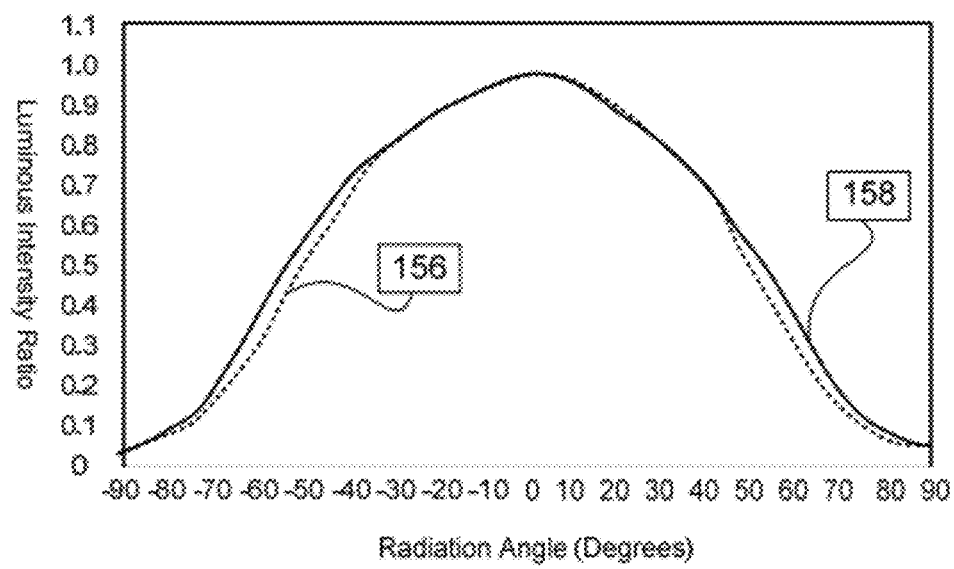
Figure 12C:
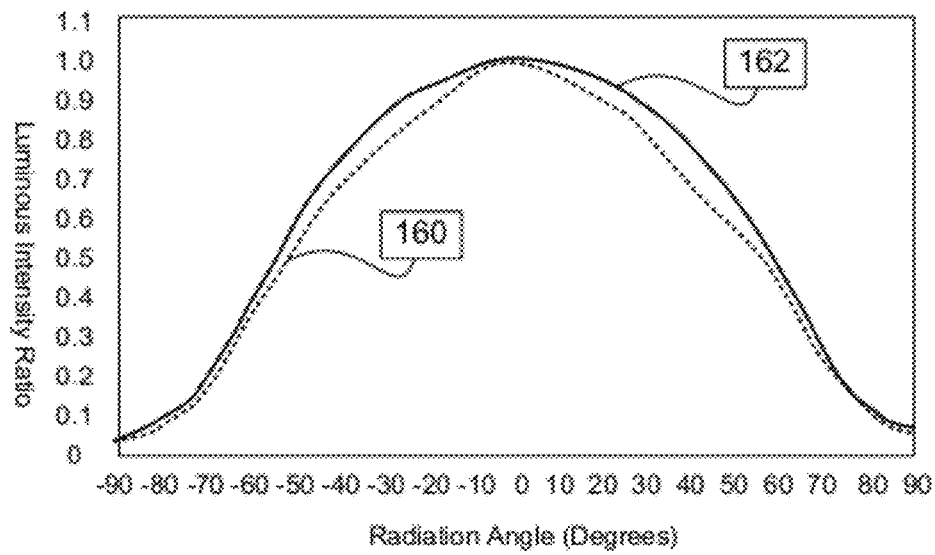
Figure 12D:
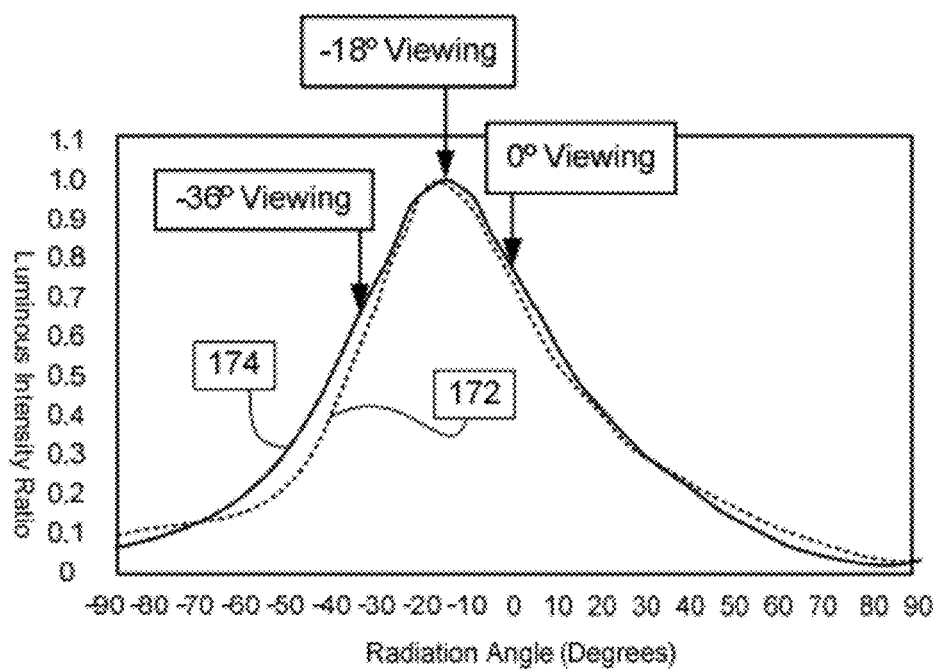

To save energy and reduce light pollution, the display includes at least one of substrate 104 having an LED device 106 with a reflector cup disclosed above. FIG. 11 illustrates LED display 100 with a viewer 140 situated at a viewing position below horizontal projection line 120. Horizontal projection line 120 represents a line substantially orthogonal to the viewing surface of display 100. The angle θ between the sight line 130 and horizontal projection line 120 is defined as a sight angle with respect to display 100. Further, because viewer 140 is situated below horizontal line 120, sight angle θ has a negative value.

FIG. 12(a-c) illustrate the horizontal FFP of LEDs 106 at a sight angle of about 0°, about −18°, and about −36°, respectively. FIG. 12(d) illustrates the vertical FFP of LEDs 106. In each of FIG. 12(a-d), the two curves depict LEDs that emit different color. For example, curves 152, 156, 160, and 172 depict an LED that emits red light, while curves 154, 158, 162, and 174 depict an LED that emits green light. As seen in the FIGS. 12(a-d), curves 152, 156, 160, and 172 respectively match curves 154, 158, 162, and 174. Accordingly, LEDs constructed in accordance with the disclosure emit different color light, yet have very similar FFP at different sight angles. In some embodiments, the disclosed LED package has a peak of FFP at about 3000 mcd at a sight angle about −18°. The corresponding working current is less than about 20 mA. In some embodiments, the working current may be less than about 10 mA. For example, to emit a peak luminous about 1253 mcd, the disclosed LED package has working current at about 8.4 mA. Thus, it is possible to save about 32% of power by using the disclose LED packages.

Figure 13A:
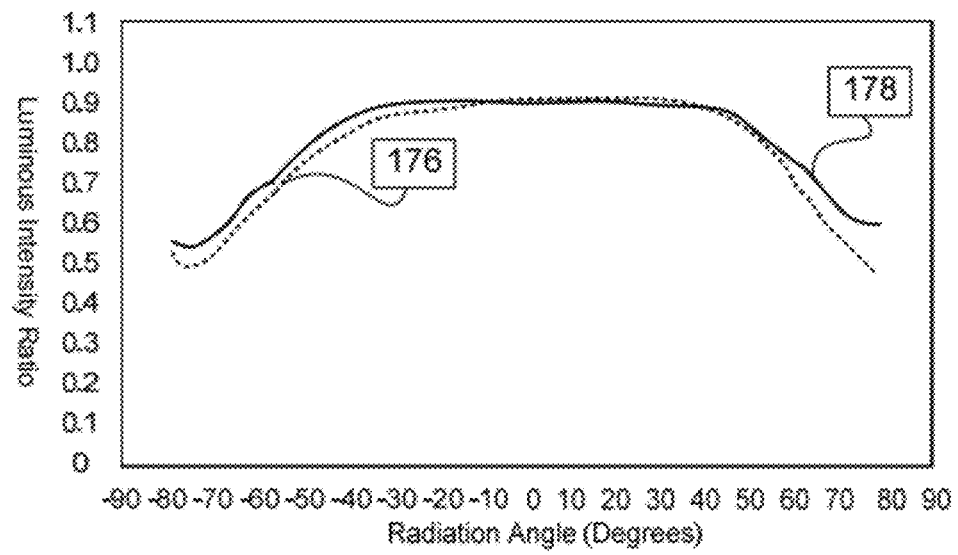
FIG. 13($a$) is a plot of the horizontal screen curve of an LED screen according to one embodiment.
Figure 13B:
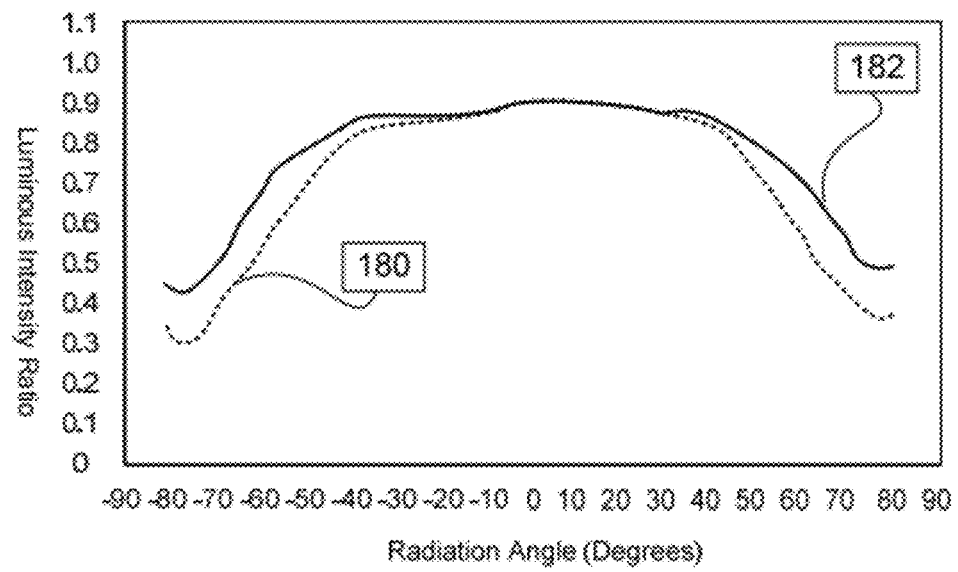
Figure 13C:
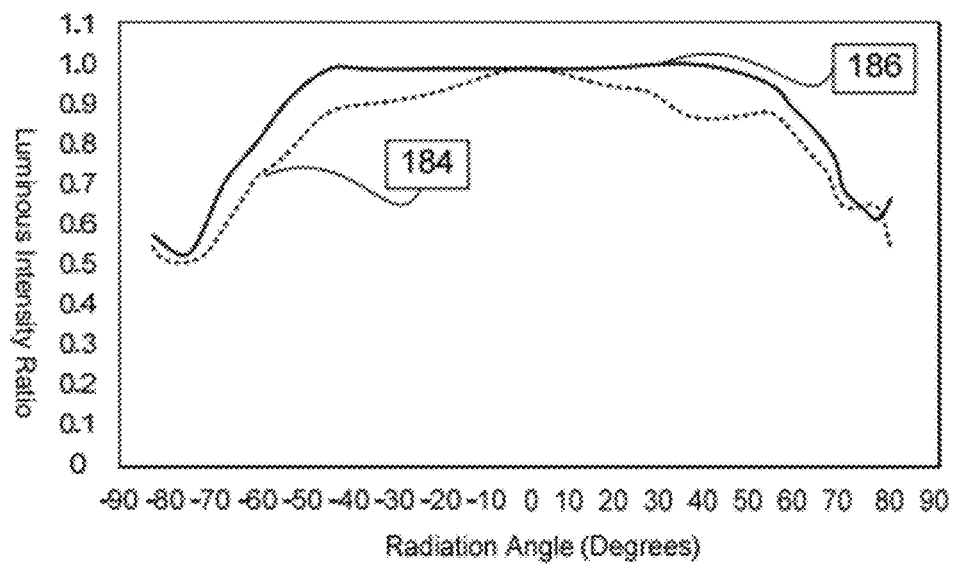
Figure 13D:
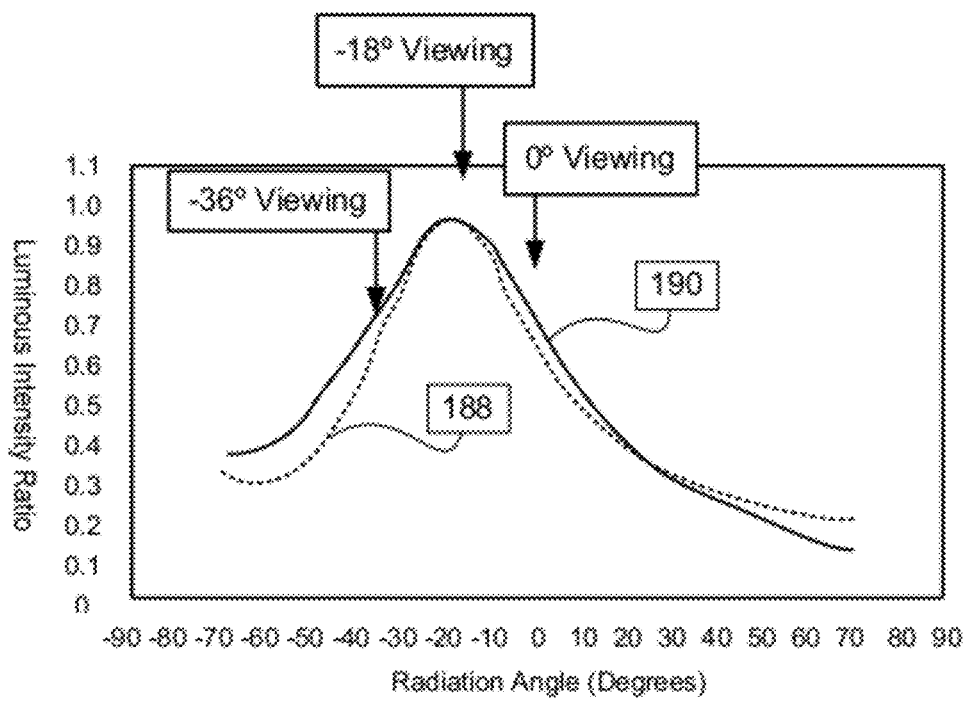

Screen curve is an optical characteristic of a display screen that illustrates a normalized luminous intensity ratio at different radiation angles. Those skilled in the art recognize that it is advantages if screen curves closely match for the different colors produced by an LED display. FIG. 13(a-c) illustrate the horizontal screen curves of LED display 100 at a sight angle about 0°, about −18°, and about −36°, respectively. FIG. 13(d) illustrates the vertical screen curve of LED display 100. In each of FIG. 13(a-d), the two curves depict LEDs that emits different colors. For example, curves 176, 180, 184, and 188 depict screen curves where all pixels of LED display 100 emit red light. Correspondingly, curves 178, 182, 186, and 190 depict screen curves when all pixels of LED display 100 emit green light. Since curves 176, 180, 184, and 188 respectively match curves 178, 182, 186, and 190, LED display 100 desirably exhibits very similar screen curves when emitting different colors.

Further, LED display 100 has a relatively wide horizontal view angle centered at about 0°. Correspondingly, LED display 100 has a relatively narrow vertical view angle centered at about −8° to about −28°. More preferably, LED display 100 has a relatively narrow vertical view angle centered at about −13° to about −23° and, most preferably a relatively narrow vertical view angle centered at about −18°.

From the foregoing, it can be seen that the present embodiments provide an LED package that includes a reflector cup having a bottom surface and a wall surface, inclined relative to the bottom surface and defining an opening at an upper end thereof. An LED mounted on the bottom surface and may be at least partially covered by an asymmetric lens. The light emitted from the LED packages disclosed herein is thus tilted and directed towards the eyes of a viewer below an LED display including the LED packages arranged in accordance with the disclosure. Further, the amount of wasted light is reduced in giant displays screens incorporating the disclosed LED packages.

It is therefore intended that the foregoing detailed description be regarded as illustrative rather than limiting, and that it be understood that it is the following claims, including all equivalents, that are intended to define the spirit and scope of this disclosure.

We claim:

1. A light emitting diode (LED) package comprising:
a reflector cup having a bottom surface and a wall surface inclined relative to the bottom surface and defining an opening at an upper end thereof; and
an LED mounted on the bottom surface,
wherein the bottom surface has a first axial dimension along a first axis and a second axial dimension along a second axis orthogonal to the first axis; and
wherein a crossing point of the first and second axis is asymmetrically positioned with respect to a geometric center of the of the bottom surface.

2. The LED package of claim 1, wherein the first axial dimension is about 0.2 mm to about 0.4 mm longer than the second axial dimension.

3. The LED package of claim 1, wherein an area of the bottom surface is greater than an area of a bottom surface of the LED and less than an area of the opening.

4. The LED package of claim 1, wherein the first axial dimension is about 0.95 mm to about 1.05 mm.

5. The LED package of claim 1, wherein the second axial dimension is about 0.75 mm to about 0.85 mm.

6. The LED package of claim 1, wherein the wall surface has a height about 0.2 mm to about 0.3 mm.

7. The LED package of claim 1, wherein the LED is displaced away from a crossing point of a first and second axis.

8. The LED package of claim 1, wherein a crossing point of the first and second axis coincides with a geometric center of the bottom surface.

9. A light emitting diode (LED) package comprising:
a reflector cup having a bottom surface and a wall surface inclined relative to the bottom surface and defining an opening at an upper end thereof; and
an LED mounted on the bottom surface,
wherein a geometric center of the opening is displaced away from a crossing point of the first and second axis.

10. The LED package of claim 1, wherein a geometric center of the opening coincides with a crossing point of the first and second axis.

11. The LED package of claim 1, wherein a wall extending away from the wall surface has non-uniform thickness.

12. The LED package of claim 11, wherein a degree of inclination of the wall surface relative to the bottom surface continually varies such that the wall surface has a steep portion and a shallow portion.

13. The LED package of claim 12, wherein the shallow portion is inclined at an angle of about 40° to about 50° relative to the bottom surface, and the steep portion is inclined at an angle of about 50° to about 85° relative to the bottom surface.

14. The LED package of claim 2, wherein the ratio of the first axial dimension to the second axial dimension is about 5:4.

15. A light emitting diode (LED) package comprising:
a reflector cup having a bottom surface and a wall surface inclined relative to the bottom surface and defining an opening at an upper end thereof; and
an LED mounted on the bottom surface,
further comprising a dome-shaped lens asymmetrically positioned with respect to a geometric center of the bottom surface and that covers the reflector cup.

16. The LED package of claim 15, wherein the lens has an asymmetric cross-section having a first dimension of about 3.5 mm to about 4.5 mm and a second dimension orthogonal to the first dimension of about 2.5 to about 3.5 mm.

17. The LED package of claim 16, wherein the lens has a profile height of about 5.3 mm to about 7.3 mm.

18. The LED package of claim 15, wherein the lens has rounded upper surface having a geometric center that is displaced about 0.2 mm to about 0.4 mm away from the geometric center with respect to a bottom cross-section of the lens.

19. The LED package of claim 15, wherein LED package generates a peak luminous intensity of about 3000 mcd and has a working current less than about 20 mA.

20. A light emitting diode (LED) package comprising:
a reflector cup having a bottom surface and a wall surface inclined relative to the bottom surface and defining an opening at an upper end thereof; and
an LED mounted on the bottom surface,
wherein the bottom surface has a first axial dimension along a first axis and a second axial dimension along a second axis orthogonal to the first axis, the bottom surface has a curved border portion and a straight border portion, the curved border portion has a length greater than half of a perimeter of the bottom surface.

21. The LED package of claim 20, wherein the straight border portion has a length less than the first axial dimension.

22. A light emitting diode (LED) package comprising:
a reflector cup having a bottom surface and a wall surface inclined relative to the bottom surface and defining an opening at an upper end thereof; and
an LED mounted on the bottom surface,
wherein the bottom surface has a first axial dimension along a first axis and a second axial dimension less than the first axial dimension along a second axis orthogonal to the first axis, and
wherein the LED is mounted on the second axis and away from a crossing point of the first and second axis.

23. The LED package of claim 22, wherein the wall surface has a height less than about 0.25 mm.

24. The LED package of claim 23, wherein the height is less than about 0.2 mm.

25. The LED package of claim 23, wherein the height is less than about 0.15 mm.

26. The LED package of claim 23, wherein the height is about 0.16 mm to about 0.24 mm.

27. The LED package of claim 1, wherein the first axial dimension is about 0.91 mm to about 1.1 mm and the second axial dimension is about 0.66 mm to about 0.91 mm.

* * * * *